United States Patent [19]
Atkins

[11] Patent Number: 5,933,011
[45] Date of Patent: Aug. 3, 1999

[54] GROUND PATH TESTING

[75] Inventor: Ian Atkins, Cary, N.C.

[73] Assignee: Raychem Corporation, Menlo Park, Calif.

[21] Appl. No.: 08/880,704

[22] Filed: Jun. 23, 1997

[30]     Foreign Application Priority Data

Jun. 25, 1996 [GB] United Kingdom .................... 9613287

[51] Int. Cl.⁶ .................................................. G01R 31/02
[52] U.S. Cl. ............................ 324/509; 340/649; 379/26
[58] Field of Search .............................. 379/26; 340/649; 324/509, 625, 510

[56]              References Cited

U.S. PATENT DOCUMENTS

| 1,421,702 | 7/1922 | McCurdy ................................... 379/26 |
| 4,051,333 | 9/1977 | Schomburg . |
| 4,197,435 | 4/1980 | Jackson et al. . |
| 4,638,245 | 1/1987 | MacPhee et al. . |
| 4,691,337 | 9/1987 | Held-Elbert et al. . |
| 5,218,616 | 6/1993 | Stephens . |
| 5,436,953 | 7/1995 | Nilson ...................................... 379/26 |

FOREIGN PATENT DOCUMENTS

| 0200038 A2 | 4/1986 | European Pat. Off. . |
| 0338107 | 10/1988 | European Pat. Off. . |
| 2509661 | 9/1976 | Germany ............................... 324/509 |
| 2809596 | 9/1979 | Germany ............................... 324/509 |
| 2031248 | 4/1980 | United Kingdom . |
| 2191591 | 12/1997 | United Kingdom . |

*Primary Examiner*—Josie Ballato
*Assistant Examiner*—Jose M. Solis
*Attorney, Agent, or Firm*—Herbert G. Burkard; Harold T. Tsiang

[57]              ABSTRACT

A method and device for testing the quality of a ground path, particularly although not exclusively for a telecommunications system. The device has terminals for connection to respective lines, such as tip and ring. A terminal is provided for connection to the local ground. Voltage-sensitive switches of increasing threshold voltage are alternatively connected between the local ground and each of the tip and ring lines via a rotary or other selector switch and the terminals. Current will flow if the local ground potential exceeds the threshold voltage of the voltage sensitive switches. A device responsive to mains frequency, e.g. a butt-in head set, provides an audible sound (mains hum) indicating the ground potential rise exceeds the threshold of the selected voltage-sensitive switch.

8 Claims, 3 Drawing Sheets

GROUND PATH TESTING

BACKGROUND OF THE INVENTION

1. Field of the Invention

The present invention relates to a method and device for testing the quality of a ground path, particularly although not exclusively for a telecommunications system.

2. Introduction to the Invention

Telecommunications systems are generally grounded at central offices, etc., and also at various other points throughout the network. These other grounds are referred to in this specification as local grounds. It is testing of the quality of the path between, for example a local ground and a remote ground that is the principal subject of this invention. Poor quality ground paths may result from a variety of causes including low soil conductivity or the presence in the locality of ground return paths to power generating stations, etc.

As a result, a local ground might not be at the same potential as the remote ground at the central office, etc. This phenomenon may be referred to as a ground potential rise. A ground potential rise can cause malfunctioning of electrical systems and can be dangerous to workers during installation, maintenance or use. The problem is known, and workers typically test for it by connecting a meter between the local ground and some relevant part of the electrical system under test (such as the lines of a telecommunications system). A particular reading on the meter will indicate that a problem exists, but the severity of the problem will not be immediately apparent.

Meters are often unreliable or need calibrating. Also, there is no widely accepted standard as to what local ground voltage is acceptable, what should be logged for future routine investigation, and what should give rise to immediate emergency correction.

SUMMARY OF THE INVENTION

I have now designed a method of testing that need respond only when a ground potential rise exceeds a predetermined value.

Thus, the present invention provides a method of testing a local grounding point of a telecommunications or other electrical system for mains voltage, the system having two lines (such as the so-called tip and ring) that are connected to ground, generally indirectly, at a remote location, which two lines have different impedances to the remote ground, which method comprises:

(a) connecting each line to the local ground, at least one of the lines being connected via an impedance, (b) connecting between the lines a head-set (such as a so-called butt-in set) or other device responsive to mains frequency, preferably one producing a sound and/or visible warning or other record.

The connection in step (a) establishes a ground loop, part of which comprises the two lines in parallel. These two lines carry different currents, giving rise to a voltage drop across them. Such a voltage drop can be detected by the device connected in step (b).

The two lines of a telecommunication system may be regarded as being grounded at the remote location as follows. At the central office, etc., the lines are provided with a DC bias, generally of about 48 volts, with one side of this DC supply being grounded. The other line may be regarded as being grounded to mains frequency signals since it too is connected to ground, albeit through the internal impedance of the battery or other source of the DC bias. This impedance may result in the two lines having a different impedance between the two connections to the local ground and the connection to the remote ground. As a result of this (and/or other) difference in impedance, different currents will flow in the two lines when a ground potential rise exists at the local ground. A potential difference will then exist between the two lines. Such potential difference can be detected by the device responsive to mains frequency connected in step (b). For example a head-set will produce a mains frequency hum.

I prefer that in step (a) each line be connected to the local ground via an impedance. Preferably the respective impedances via which each line is connected have substantially the same value. I also prefer that each line be thus connected via a capacitance, and again I prefer that the capacitances in each line have substantially the same value. Those capacitances may prevent a DC bias on the lines from shorting through the connection to the local ground made in step (a) above. A voltage drop will occur across each of these impedances/capacitances, but its magnitude will be greater (due to the greater current) in the line that is directly grounded at the remote ground, than in that line that is "grounded" through the internal impedance of the battery etc. that provides the DC bias. This gives rise to the potential difference between the lines referred to above.

The capacitance (plus impedance) preferably has an impedance of at least 10 KΩ, more preferably about 30 KΩ at mains frequency, generally at 50 or 60 Hz. In this way, a ringing signal supplied by the central office will not flow to ground.

In the basic method outlined above, any ground potential rise will be detected, provided the ground potential rise supplies enough power to activate the heat-set or other device. I prefer however that only local ground potentials above a predetermined level be detected. In order to achieve this, I prefer to employ voltage-sensitive switches between each line and the local ground. Thus, the impedances referred to above may comprise voltage-sensitive switches. Such switches may comprise zener or other diodes, varistors, foldback devices or neon tubes, etc. In any case, there will desirably be some threshold voltage at which the resistance of the switch markedly decreases. Preferably the switch has effectively infinite resistance below the threshold voltage, and effectively negligible resistance above the threshold voltage. A local ground potential will not then be detected unless the ground potential rise is some predictable amount (determined by line resistance etc.) above the threshold voltage of the voltage-sensitive switches.

The engineer in the field might be interested in whether the local ground potential falls within one of various levels. These could include, for example, 0–5 volts (normal), 5–15 volts (not dangerous, but some corrective action needed in due course), 15–40 volts (care needs to be taken, and action required shortly) and above 40 volts (emergency action required). My invention is able to provide this information in a particularly convenient and reliable way, without recourse to reading meters and remembering the significance of particular voltages. A series of voltage sensitive switches can be provided, preferably for each line. Each pair of such switches will have a different threshold voltage, for example 5 volts, 15 volts and 40 volts in the example above. Three pairs of switches would be switched into and out of the connections between respective lines and the local ground, using for example a single rotary switch. Alternatively a separate switch could be provided for each voltage-sensitive switch but this will be less convenient. In general, therefore, I prefer to use a switch having a state corresponding to each of the sequentially-made connections.

The method of the invention could therefore be carried out as follows. Connections are made to each line of the telecommunications system and to the local ground, and a butt-in set (essentially a pair of head phones) is connected across the lines. The rotary or other switch controlling the voltage-sensitive switches is set to its lowest setting (5 volts in the above example). If no mains hum is heard in the butt-in set, then the local ground potential is less than, say, 5 volts (assuming no voltage drop along the lines to the central office—any such voltage drop can be compensated for). If there is a mains hum, the rotary switch is turned to replace the 5 volts voltage-sensitive switch by the 15 volts switch. If the hum stops, the engineer knows that the local ground voltage is between 5 and 15 volts. If not, the next higher setting is tried. It will be seen that any degree of sensitivity, and levels of voltage, can be chosen by use of the appropriate number and type of voltage-sensitive switches. Thus, voltage-sensitive switches of increasing threshold voltage are connected sequentially at least until the device connected in step (b) above ceases to respond to mains frequency or until the switch of highest threshold voltage is connected.

The method of the invention may be used for ad hoc testing, or it may be adapted to form at least part of a monitoring system.

The invention therefore also provides a method of monitoring a local ground of a telecommunications or other electrical system for mains voltage, which comprises:

(1) carrying out the basic test method of the invention; and (2) periodically or continuously recording, for example electronically or mechanically on a chart, an output of said device responsive to mains frequency; and optionally (3) raising an alarm if the output of said device responsive to mains frequency indicates a local ground voltage above a predetermined value.

The basic test method referred to above may of course include sequentially connecting the various voltage-sensitive switches into the circuit. Software or other means may be provided for determining from the raw results the voltage band into which the local ground voltage falls.

Instead of (or additionally if desired) periodically carrying out the recording step, the connections (a) and/or (b) above may be made periodically.

In addition to providing various methods, the invention also provides a corresponding device, namely one which has:

(a) first and second terminals for connection to respective lines of a telecommunications or other electrical system;

(b) a third terminal for connection to a local ground of the electrical system;

(c) fourth and fifth terminals between which can be connected a device responsive to mains frequency;

(d) a first connector positionable between the first and fourth terminals;

(e) a second connector positionable between the second and fifth terminals, said second connector comprising a first voltage-sensitive switch, and a first capacitor;

(f) a third connector positionable between the second and fifth terminals, said third connector comprising a second voltage-sensitive switch having a threshold-voltage different from that of the first voltage-sensitive, and a second capacitor; and (g) means for making connection using alternately the second and third connectors; and optionally (h) a head-set (such as a so-called butt-in set) or other device responsive to mains frequency, preferably one producing a sound and/or visible warning or other record.

The first connector preferably includes a third voltage-sensitive switch and a third capacitor; and the device preferably has a fourth connector positionable between the first and fourth terminals, the fourth connector comprising a fourth voltage sensitive switch having a threshold value different from that of the voltage-sensitive switch of the first connector. The means in step (g) above preferably makes connections alternately using the first and fourth connectors.

The first voltage-sensitive switch, and where present, the third voltage-sensitive switch, preferably have a threshold-voltage less than 40 volts, more preferably less than or equal to 20 volts. I also prefer that these threshold voltages be equal to or greater than 5 volts.

The second voltage-sensitive switch, and where present, the fourth voltage-sensitive switch, preferably have a threshold voltage greater than 40 volts.

Further connectors having other voltage-sensitive switches of different threshold voltages (and generally also having a capacitor) may be included depending on the accuracy required.

BRIEF DESCRIPTION OF THE DRAWINGS

The invention is further illustrated with reference to the accompanying drawings, in which.

DETAILED DESCRIPTION OF THE INVENTION

Figure 1:
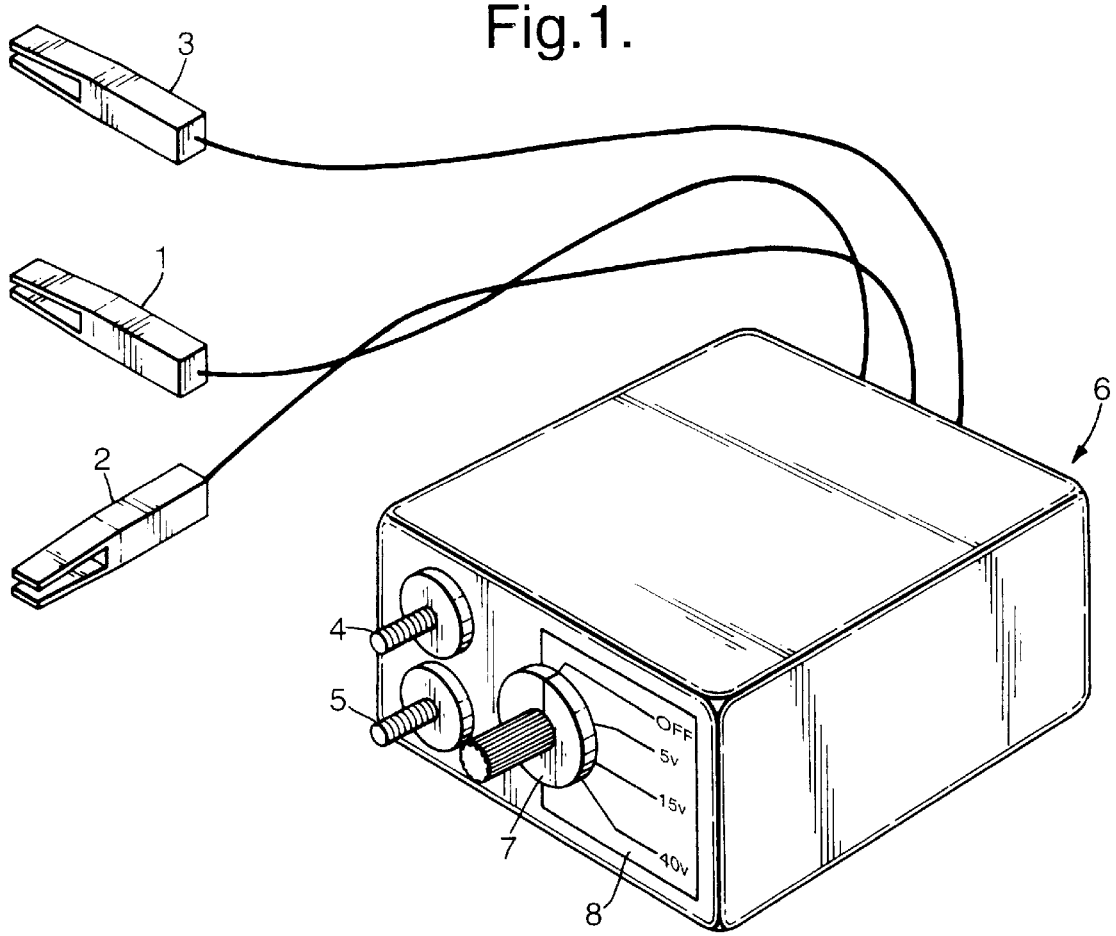
FIG. 1 shows a device according to the invention.

FIG. 1 shows a device for testing the quality of a local ground, which device has various terminals as follows. First terminal 1 and second terminal 2 are for connection to respective lines of an electrical system, such as the tip and ring of a telecommunications system. A third terminal 3 is provided for connection to the local ground. Spring clips are shown for connection to the lines, but other means may be provided. A butt-in set (essentially a pair of head-phones) may be connected to fourth terminal 4 and fifth terminal 5. These terminals are shown as screw threads, but again other connectors, such as spring clips could be used. The device is preferably in the form of a light-weight portable, hand-held, box 6, but may form part of larger equipment especially when used for monitoring rather than ad hoc testing.

A rotary or other switch 7 may have various positions depending on the accuracy of measurement required. It may also have, as shown, an "off" position in which the local ground is isolated from the tip and ring. In the other positions, voltage-sensitive switches of increasing threshold voltage are connected between the local ground (via terminal 3) and each of the tip and ring (via terminals 1 and 2).

As indicated above, the engineer makes the connections referred to, turns the switch 7 to the first position, marked 5 V on the scale 8 of FIG. 1, and listens on the butt-in set for mains hum. If there is hum then the local ground potential is less than 5 volts, and in general no corrective action need be taken. (The marking of the device can take into account any likely voltage drop along the tip and ring lines.) If mains hum is heard, the switch 7 is rotated to the second position, marked 15 V. If there is no hum, the local ground potential is between 5 and 15 volts. Depending on local regulations, this result might mean that a fault should be logged for later routine maintenance. If mains hum remains, the switch is rotated further to the 40 V position, and if the hum then continues the circuit may be regarded as dangerous and emergency corrective action should be taken. If the hum stops, the fault is likely to require swift action but unlikely to be dangerous.

These voltage levels are given merely by way of example and should not be taken as indicating safety or danger in any particular electrical system. Local specifications and safety regulations must, instead, be consulted.

Figure 2:
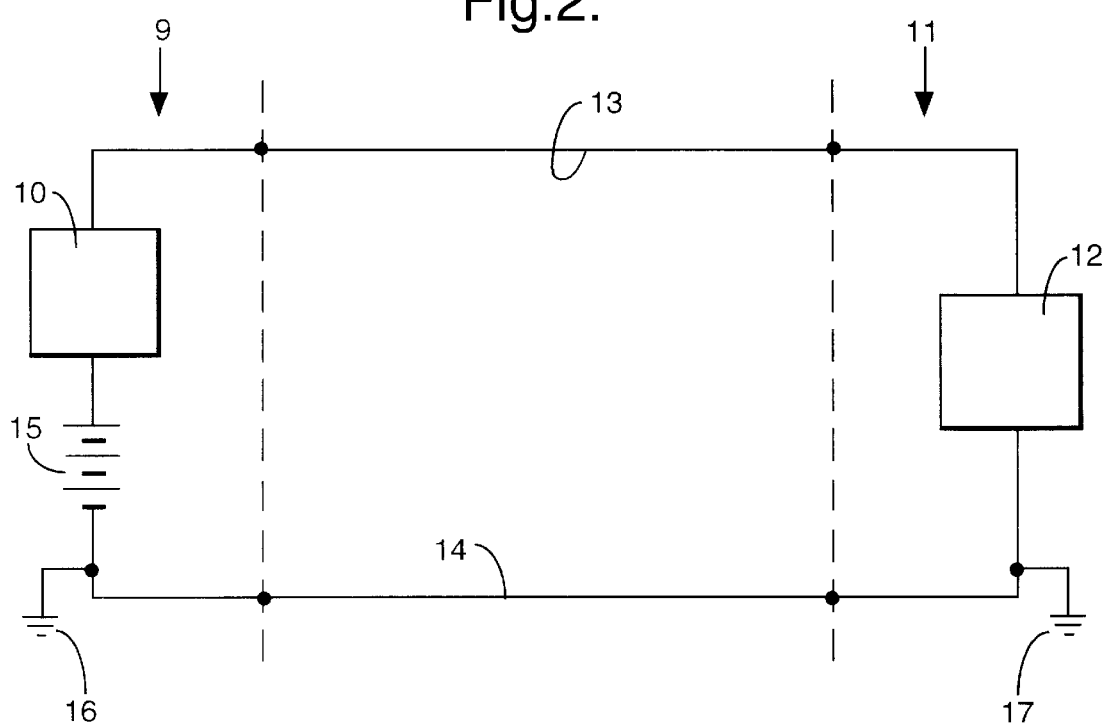
FIG. 2 shows schematically a basic telecommunications system.

FIG. 2 shows schematically a basic telecommunications system comprising a central office or exchange 9 having a receiving/transmitting device 10, a subscriber etc. 11, again having a receiving/transmitting device 12, and tip and ring lines 13, 14 interconnecting the central office 9 and the subscriber 11. The exchange also has a battery 15 or other means providing DC bias on the lines. The circuit will be grounded at the exchange at one side of the battery 15 as indicated at 16. Thus, the ring line 14 may be regarded as directly grounded at the remote ground 16, and the tip line 13 may be regarded as grounded to mains frequency signals via the internal impedance of the battery 15. The subscriber or other part of the network (such as a terminal block) or other connection point will have a local ground 17.

The problem that the invention seeks to overcome is detection of a fault in the local ground 17. A potential may arise at the local ground 17 for various reasons, for example a power system grounded via the same grounding point as the local ground 17 may cause local ground 17 to rise in potential above the remote ground 16 if there is some resistance in the common grounding point. Also return current within the soil from local power stations can cause grounding points to vary in potential. Whatever the phenomenon or fault, the effect is that remote ground 16 and local ground 17 might be at different potentials. For convenience, this is referred to as a ground potential rise at the local ground, whatever the polarity.

The invention will in general be employed to test the local ground by connecting the device of FIG. 1 to local ground 17 and to the tip and ring 13, 14 at the subscriber, etc. 11.

Figure 3:
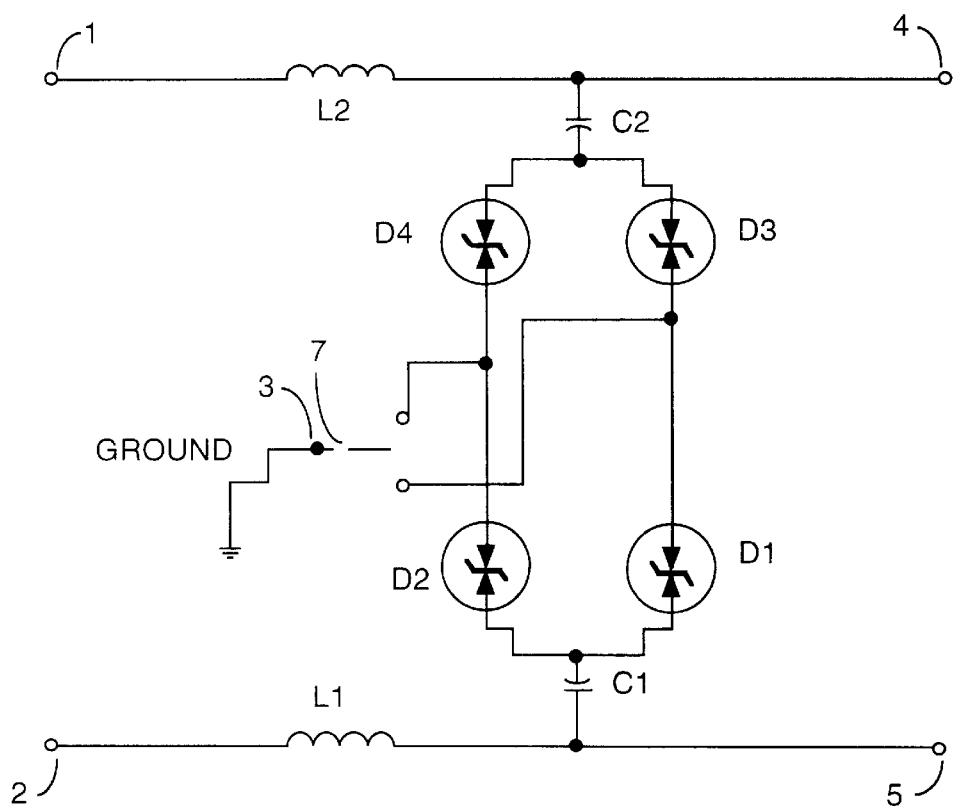
FIG. 3 shows electronic circuitry of a device according to the invention.

A preferred electronic circuit for carrying out the invention is shown in FIG. 3. The terminals 1 and 2 are connected to the tip and ring 13, 14 of FIG. 2 at the subscriber etc. 11, and the terminal 3 is connected to the local ground 17. A butt-in set is connected across terminals 4 and 5. It may be noted that this circuit has similarities in the components it preferably employs to circuits disclosed in WO92/06523 (Raychem), although the method of use and the problems solved in the two inventions are quite different.

A potential difference of sufficient magnitude between terminal 3 and the remote ground 16 (caused by the rise in ground potential due to the effect of the mains discussed above), will cause AC current to flow along two parallel paths, namely the tip line 13 and the ring line 14. The path through the tip line 13 will have a greater impedance due to the internal impedance of the battery 15. There will therefore be a greater voltage drop across diode D1 and capacitor C1 than across diode D3 and capacitor C2 (when the switch 7 is in the lower position). As a result, there will be a potential difference between terminals 4 and 5 to which the butt-in set is to be connected. A mains hum will therefore be heard. The frequency of the hum will correspond to the mains frequency, being equal to it, without rectification, or double it with rectification.

Current will flow, and a mains hum be heard, only if the local ground potential at terminal 3 is sufficient to exceed the threshold voltage of diodes D1 and D3 (when switch 7 is in the lower position) or of diodes D2 and D4 (when switch 7 is in the upper position). Thus, the magnitude of the ground potential can be estimated according to whether or not mains hum is heard.

Capacitors C1 and C2 or other means may be included to prevent the DC bias from battery 15 passing through the testing device and thereby shorting at the connection to the local ground. Such capacitors may be provided in the loop between the two lines created by their connection to the local ground. A DC bias of 48 volts is typical as this would in general switch any diodes or other voltage-sensitive switches of low threshold voltage. If one was only interested in ground potential rises greater than the DC bias, such means could be dispensed with.

Some protection against high frequency transients may be provided, for example inductors L1 and L2. The resulting filtering arrangement can have the benefit of removing any induced RF signal, which could lead to confusion when using the butt-in set. Also, overcurrent protection for the device and/or butt-in set may be provided. For example, current-sensitive switches may be provided in series with the tip and ring lines, at the terminals 1, 2 and/or terminals 4, 5. Suitable switches include those based on conductive polymers, particularly carbon-loaded polymers such as those marketed by Raychem under the trade mark "Polyswitch".

The capacitors preferably have a capacitance from 25–200 nF, especially about 100 nF, and the inductors preferably have an inductance from 5 $\mu$H to 2 mH, especially about 220 $\mu$H.

Figure 4:
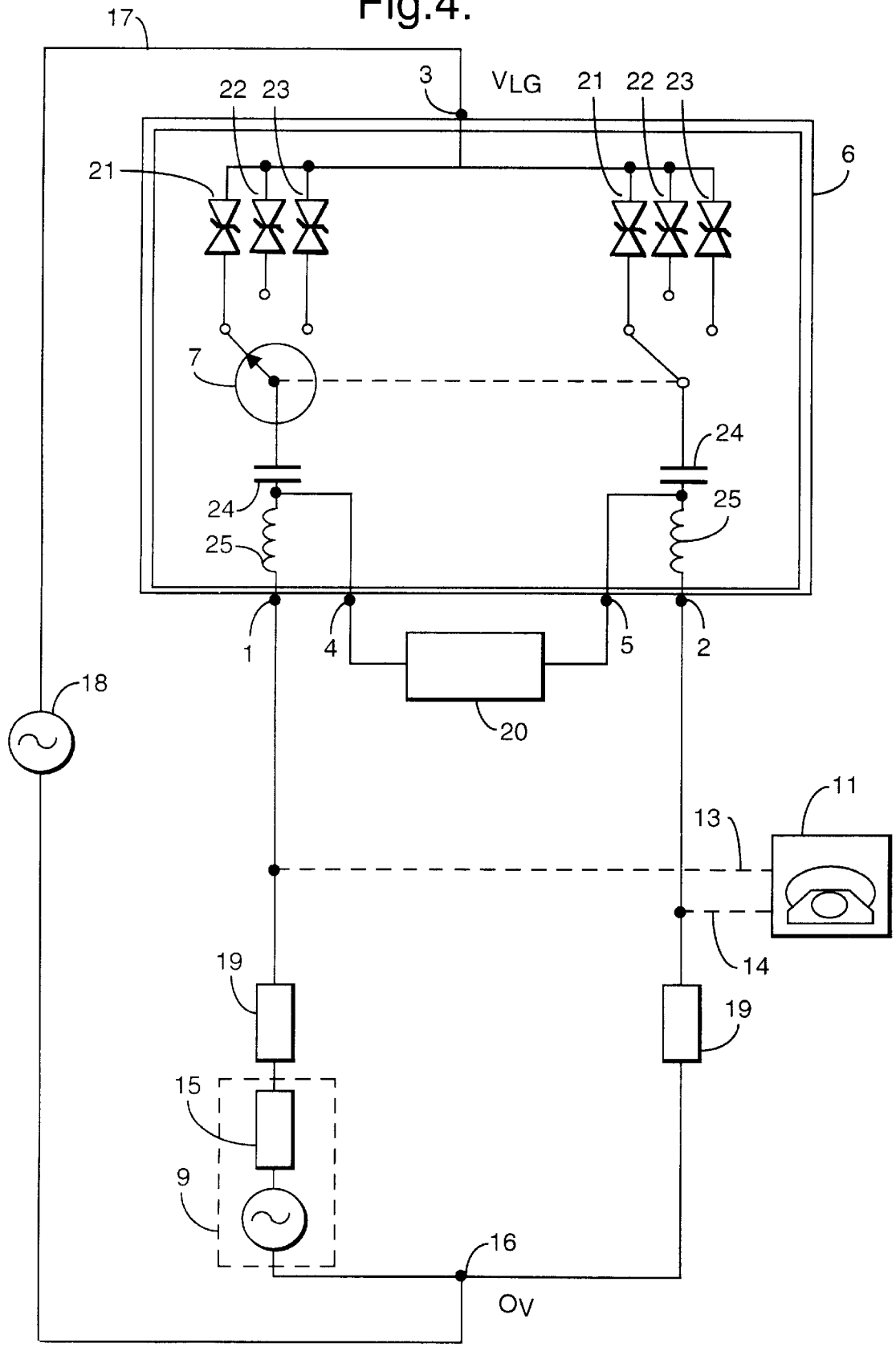
FIG. 4 shows a circuit that is created when a device of the invention is in use.

FIG. 4 shows the AC circuit that is created when a device 6 of the invention is in use.

The reference numerals are as before. Thus, a central office 9 (including means for generating voice band signals) is connected by tip and ring lines 13, 14 to a subscriber 11. Line resistances 19, typically 2 K$\Omega$, are shown. The impedance to mains frequency of the DC bias battery is shown as resistor 15.

A device of the invention 6 is connected by its terminals 1 and 2 to the tip and ring 13, 14, and to a local-ground 17 by its terminal 3. A butt-in set 20 is connected to its terminals 4 and 5.

A ground fault due to the mains 18 is shown providing a potential difference in the ground loop between remote ground 16 (at say 0 volts) and the local ground 17 at (at $V_{LG}$).

In this embodiment, the device has three diodes 21, 22, 23 for each line. They can be connected sequentially by switch 7. Switch 7 is shown schematically to control the switching of both sets of diodes. The two parallel paths for the ground loop current can be clearly seen from FIG. 4. The left-hand path will have a greater impedance to mains frequency current due to battery impedance 15. It can be seen that a potential difference will exist across terminals 4 and 5 once $V_{LG}$ exceeds the threshold voltage of the relevant diode 21, 22 or 23 (plus the voltage drop across the impedances 15 and 19).

I claim:

1. A device for testing a local grounding point of an electrical system for mains voltage, the system having two lines that are indirectly connected to ground at a remote location, which two lines have different impedances to the remote ground, the device comprising:

(a) first and second terminals for connection to respective lines of an electrical system;

(b) a third terminal for connection to a local ground for the electrical system;

(c) fourth and fifth terminals between which can be connected a device responsive to mains frequency;

(d) a first connector positionable between the first and fourth terminals;

(e) a second connector positionable between the second and fifth terminals, said second connector comprising a first voltage-sensitive switch, and a first capacitor;

(f) a third connector positionable between the second and fifth terminals, said third connector comprising a second voltage-sensitive switch having a threshold voltage different from that of the first voltage-sensitive switch, and a second capacitor; and (g) means for making connections using alternatively the second and third connectors.

2. A device according to claim 1, in which the first connector includes a third voltage-sensitive switch and a third capacitor; and the device comprises a fourth connector positionable between the first and fourth terminals, the fourth connector comprising a fourth voltage-sensitive switch having a threshold voltage different from that of the third voltage sensitive switch, and means for making connections using alternatively the first and fourth connectors.

3. A device according to claim 1, in which the first voltage-sensitive switch, and where present, the third voltage-sensitive switch, have a threshold voltage less than 40 volts.

4. A device according to claim 3, in which said threshold voltage is between 5–20 volts.

5. A device according to claim 1, in which the second voltage-sensitive switch, and where present, the fourth voltage-sensitive switch, have a threshold voltage greater than 40 volts.

6. A device according to claim 1, in which a device responsive to mains frequency is connected between the fourth and fifth terminals.

7. A device according to claim 6, in which the device responsive to mains frequency produces an audible sound in response to mains frequency.

8. A device according to claim 7, in which the device responsive to mains frequency comprises a butt-in set.

* * * * *